Figure 1:
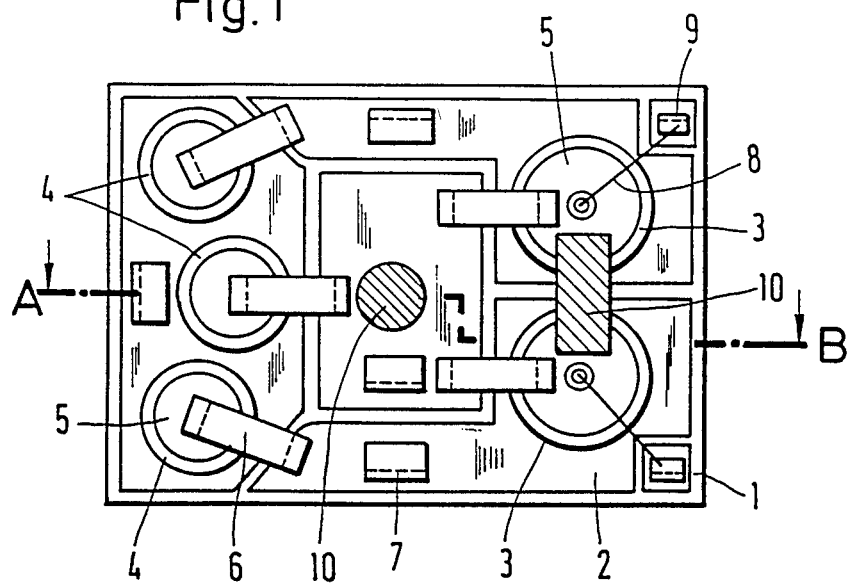

United States Patent [19]

Neidig

[11] Patent Number: 4,731,644

[45] Date of Patent: Mar. 15, 1988

[54] SEMICONDUCTOR POWER MODULE WITH CERAMIC SUBSTRATE

[75] Inventor: Arno Neidig, Plankstadt, Fed. Rep. of Germany

[73] Assignee: Brown, Boveri & Cie AG, Mannheim, Fed. Rep. of Germany

[21] Appl. No.: 874,572

[22] Filed: Jun. 16, 1986

[30] Foreign Application Priority Data

Jun. 15, 1985 [DE] Fed. Rep. of Germany ....... 3521572

[51] Int. Cl.⁴ ................... H01L 23/30; H01L 23/04; H01L 23/10; H01L 21/447

[52] U.S. Cl. ....................................... 357/72; 357/74; 357/79

[58] Field of Search ...................... 357/81, 72, 82, 79, 357/80

[56] References Cited

U.S. PATENT DOCUMENTS 3,585,455  6/1971  Naylor et al. .................... 357/75
4,558,510  12/1985  Tani et al. ........................ 357/72

Primary Examiner—Andrew J. James
Assistant Examiner—S. V. Clark
Attorney, Agent, or Firm—Herbert L. Lerner; Laurence A. Greenberg

[57] ABSTRACT

A semiconductor power module includes a plastic housing, a ceramic substrate with upper and lower surfaces being disposed in the housing, upper and lower metallizations respectively disposed on the upper and lower surfaces of the substrate, components disposed on the upper metallization, at least one support having upper and lower parts and being disposed on the substrate in the housing, a first elastomeric soft casting compound disposed in the housing covering the substrate and the lower part of the at least one support, the upper part of the at least one support protruding from the first casting compound, and a second thermo-setting hard casting compound covering the upper part of the at least one support and connecting the upper part to the housing.

16 Claims, 2 Drawing Figures

SEMICONDUCTOR POWER MODULE WITH CERAMIC SUBSTRATE

The invention relates to a semiconductor power module, including a ceramic substrate metallized on both sides, components disposed on the upper side of the substrate, a plastic housing in which the substrate is disposed, and casting resin covering the substrate. Such semiconductor power modules are used in converter technology.

In such semiconductor power modules, the dissipation heat which is produced is removed through the lower surface of the module into a heat sink. In order to assure good heat distribution, the contact between the module and the heat sink must cover a large area. In addition, the substrate must push against the heat sink with sufficient pressure, especially in the vicinity of components generating dissipation heat. Especially for large-area substrates it is difficult to assure the required pressure over the entire contact surface. A slightly convex deflection of the substrate can be provided and adjusted by making the metal layer on the lower surface of the substrate somewhat thinner than on the upper surface. However, this measure is not always effective because the structure on the upper surface influences the deflection substantially. In addition, the soldering of components causes additional warping and it is very difficult to take this into consideration when adjusting the deflection.

In order to circumvent these difficulties, module constructions in which the substrate is braced against the housing have become known.

German Published, Non-Prosecuted Application DE-OS No. 33 23 246 discloses bracings which are formed at the plastic housing. This, however, requires the manufacture of the plastic housings with very narrow tolerances. Particularly in the case of larger housings, it is difficult to maintain these tolerances.

It is accordingly an object of the invention to provide a semiconductor power module with a ceramic substrate, which overcomes the hereinafore-mentioned disadvantages of the heretofore-known devices of this general type, and to provide a bracing which can be constructed in a simple manner.

With the foregoing and other objects in view there is provided, in accordance with the invention, a semiconductor power module, comprising a plastic housing, a ceramic substrate with upper and lower surfaces being disposed in the housing, upper and lower metallizations respectively disposed on the upper and lower surfaces of the substrate, components disposed on the upper metallization, at least one support having upper and lower parts and being disposed on the substrate or on at least one of the components in the housing, a first elastomeric soft casting compound disposed in the housing covering the substrate and the lower part of the at least one support, the upper part of the at least one support protruding from the first casting compound, and a second thermo-setting hard casting compound covering the upper part of the at least one support and connecting the upper part to the housing.

In accordance with another feature of the invention, at least one support is formed of insulating material such as ceramic having a smaller coefficient of expansion than the plastic housing and the casting compounds.

In accordance with an additional feature of the invention, the housing has ribs formed thereon at least above the at least one support for frictionally connecting the at least one support to the housing, and the at least one support and the ribs define a gap therebetween filled with the second casting compound.

In accordance with an added feature of the invention, there is provided cement fixing the at least one support to the substrate or to the at least one component or a compensation disc on the component prior to casting.

In accordance with a concomitant feature of the invention, there are provided pins soldered on the substrate or the at least one component or a compensation disc on the components, the at least one support being disposed on at least one of the pins prior to casting.

Among other things, the advantages of the construction according to the invention are that a permanently effective bracing is achieved by simple means and no assembly or adjusting fixtures are required. The housing tolerances need not meet stringent requirements. It is advantageous if the supports are formed of insulating material because in that case no consideration has to be given to voltage-carrying parts in the structure. Ribs or other formations on the housing disposed above the supports, permit the fixation of the supports and their bracing effect to be improved further.

Other features which are considered as characteristic for the invention are set forth in the appended claims.

Although the invention is illustrated and described herein as embodied in a semiconductor power module with ceramic substrate, it is nevertheless not intended to be limited to the details shown, since various modifications and structural changes may be made therein without departing from the spirit of the invention and within the scope and range of equivalents of the claims.

Figure 2:
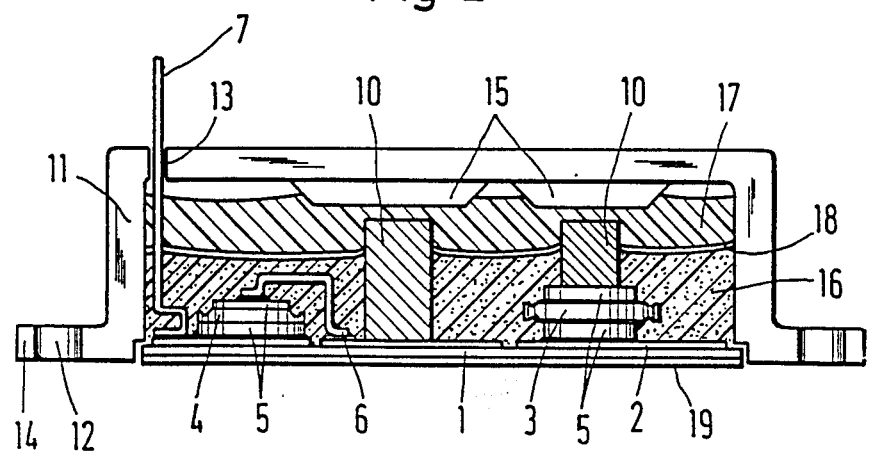

The construction and method of operation of the invention, however, together with additional objects and advantages thereof will be best understood from the following description of specific embodiments when read in connection with the accompanying drawings, in which:

FIG. 1 is a diagrammatic, top plan view of an assembled substrate according to the invention; and FIG. 2 is a cross sectional view of a cast-over module with the substrate, taken along the line A-B in FIG. 1, in the direction of the arrows.

Referring now to the figures of the drawings in detail and first, particularly, to FIG. 1 thereof, there is seen a half-controlled single-phase bridge with bypass diodes Two thyristors 3 and three diodes 4 are disposed on a structured metallization 2 on a ceramic substrate 1. Compensation discs 5 formed of molybdenum are disposed above and below the thyristors 3 and diodes 4. In order to contact the cathode side of the thyristors 3 and diodes 4 on top, metallic clips 6 are provided between the upper compensating discs 5 and the structured metallization 2. Furthermore, connecting tabs 7 which have an expansion loop are soldered to the metallization 2. Wire connections 8 lead from the gate terminals of the thyristors 3, to a flat plug base 9 for an external gate connection.

The assembled substrate 1 described above can be manufactured in the usual manner. A metallized and properly structured substrate 1 serves as a base on which the components 3, 4 and the connecting elements 5 and 9 are soldered As shown in FIG. 2, the substrate 1 is also provided with a metallization 19 on the lower surface thereof. The metallizations 2 and 19 are preferably made by direct bonding of copper to ceramic.

After the last soft-soldering process, supports 10 formed of ceramic material are fastened to the substrate 1. The coefficient of expansion of the material chosen for the supports 10 is advantageously smaller than that of the plastics used for housings and casting compounds. After cooling, this results in a slightly convex flexure of the substrate 1 at the points at which the supports 10 are employed, so that good thermal contact with a heat sink is achieved. The materials which are used for the supports 10 are inexpensive ceramics such as $Al_2O_3$, mullite or steatite. The supporting surface of the supports 10 on the substrate 1 must not be pointed since contact surfaces which are too small could lead to damage to the substrate 1 due to the mechanical stresses which occur.

The supports 10 are preferably disposed in the center of the substrate 1 and on the components 3, 4 which are especially stressed. In the illustrated embodiment, one support 10 is disposed in the middle of the substrate and a second support 10 is disposed on the upper compensation discs 5 of the two thyristors 3. Instead of the common support 10 shown for the two thyristors 3, individual annular supports 10 can, of course, be used for each thyristor 3. The support 10 would then advantageously be centered on the compensation disc 5 and the wire connection 8 for the gate terminal would be brought through an opening in the support 10.

The supports 10 can preferably be fastened by means of an adhesive. Another possibility for fastening is, for instance, to solder pins to the desired points. The supports 10 are slipped on the pins so that the pins enter corresponding openings in the supports The support 10 is not pushed upward during casting, since its specific gravity is greater than that of the casting compound. It goes without saying that other kinds of fastenings such as soldering of metallized supports 10, are also possible.

The substrate 1 is cemented into a housing along with the cemented-on supports 10. If a housing is involved which is formed of a frame and a cover separated therefrom, the installation of the supports (cementing or slipping on pins) can take place even after the substrate 1 is cemented into the frame.

In FIG. 2, a cross section through a module with a hood or cap-like housing 11 is shown. The cross section is taken through the plane A-B shown in FIG. 1, with the addition of the housing. The housing 11 has formations 14 with holes 12 for screws for fastening the module on a heat sink. The housing 11 has openings 13 formed in the upper surface thereof for bringing through the terminal elements 7, 9 and for filling in casting compound. In addition, the housing 11 has ribs 15 formed on the inside thereof. The length of the supports 10 disposed underneath the ribs 15 is chosen in such a way that a gap of about 1 mm remains between the ribs 15 and supports 10.

A casting compound 16 which is preferably elastomeric and soft is first filled in to the illustrated assembly and specifically in such an amount that the supports 10 protrude about 1 to 2 mm from the soft casting compound 16. After the soft casting compound 16 is cross-linked or polymerized, a substance such as a thermo-setting hard casting compound 17 and preferably a casting resin with an epoxy base, is filled in. Such a resin sets at about 150° C. and fastens the upper parts of the supports 10 to the housing 11 and the ribs 15. After the module is cooled, a planar to slightly convex lower surface of the substrate 1 exists.

As already explained above, the supports 10 are anchored, in the hard casting compound 17 which in turn is connected firmly to the housing 11. In the gap between the upper surface of the supports 10 and the ribs 15 or other formations on the housing 11, only as much hard casting compound 17 is accumulated as is necessary to obtain a planar lower surface for the module. This effect is primarily promoted by the fact that at the hardening temperatures of the hard casting compound 17 of about 150° C., the bending stresses which are generated by the joining process, just disappear. In order to ensure that the shrinkage of the hard casting compound 17 has no adverse effect on the support action, the gap between the upper surface of the supports 10 and the ribs 15 must not be too great. For this reason, a gap width of about 1 mm is preferred. Outside the supports 10, a gap 18 can be produced between the soft casting compound 16 and the hard casting compound 17 by shrinkage, although this gap is of no consequence for the supporting effect.

After the hard casting compound 17 is hardened and cooled, the length-wise shrinkage of the plastic housing 11 counteracts a concave deflection of the substrate 1. Since the supports 10 have a smaller coefficient of expansion, a slightly convex curvature of the substrate is achieved at the points at which the supports 10 are employed. This promotes good thermal contact between the substrate and the heat sink after the module is bolted down. As described above, the desired shape of the lower surface of the module is arrived at automatically, without the use of mounting plates or other adjusting aids.

The foregoing is a description corresponding in substance to German Application P No. 35 21 572.0, dated June 15, 1985, the International priority of which is being claimed for the instant application, and which is hereby made part of this application. Any material discrepancies between the foregoing specification and the aforementioned corresponding German application are to be resolved in favor of the latter.

I claim:

1. Semiconductor power module, comprising a cap-shaped plastic housing, a ceramic substrate with upper and lower surfaces being disposed in and forming a bottom surface of said housing, upper and lower metallizations respectively disposed on said upper and lower surfaces of said substrate, components disposed on said upper metallization, at least one support having upper and lower parts and being disposed on said substrate in said housing, a first elastomeric soft casting compound disposed in said housing covering said substrate and said lower part of said at least one support, said upper part of said at least one support protruding from said first casting compound, and a second thermo-setting hard casting compound covering said upper part of said at least one support and connecting said upper part to said housing.

2. Semiconductor power module, comprising a cap-shaped plastic housing, a ceramic substrate with upper and lower surfaces being disppposed in and forming a bottom surface of said housing, upper and lower metallizations respectively disposed on said upper and lower surfaces of said substrate, components disposed on said upper metallization, at least one support having upper and lower parts and being disposed on at least one of said components in said housing, a first elastomeric soft casting compound disposed in said housing covering said substrate and said lower part of said at least one support, said upper part of said at least one support protruding from said first casting compound, and a second thermo-setting hard casting compound covering said upper part of said at least one support and connecting said upper part to said housing.

3. Semiconductor power module according to claim 1, wherein said at least one support is formed of insulating material having a smaller coefficient of expansion than said plastic housing and said casting compounds.

4. Semiconductor power module according to claim 2, wherein said at least one support is formed of insulating material having a smaller coefficient of expansion than said plastic housing and said casting compounds.

5. Semiconductor power module according to claim 1, wherein said at least one support is formed of ceramic insulating material having a smaller coefficient of expansion than said plastic housing and said casting compounds.

6. Semiconductor power module according to claim 2, wherein said at least one support is formed of ceramic insulating material having a smaller coefficient of expansion than said plastic housing and said casting compounds.

7. Semiconductor power module according to claim 1, wherein said housing has ribs formed thereon at least above said at least one support for frictionally connecting said at least one support to said housing, and said at least one support and said ribs define a gap therebetween filled with said second casting compound.

8. Semiconductor power module according to claim 2, wherein said housing has ribs formed thereon at least above said at least one support for frictionally connecting said at least one support to said housing, and said at least one support and said ribs define a gap therebetween filled with said second casting compound.

9. Semiconductor power module according to claim 1, including cement fixing said at least one support to said substrate prior to casting.

10. Semiconductor power module according to claim 2, including cement fixing said at least one support to said at least one component prior to casting.

11. Semiconductor power module according to claim 2, including compensation discs disposed on said components, and cement fixing said at least one support to at least one of said compensation discs prior to casting.

12. Semiconductor power module according to claim 1, including pins soldered on said substrate, said at least one support being disposed on at least one of said pins prior to casting.

13. Semiconductor power module according to claim 2, including pins soldered on said at least one component, said at least one support being disposed on at least one of said pins prior to casting.

14. Semiconductor power module according to claim 2, including compensation discs disposed on said components and pins soldered on at least one of said compensation discs, said at least one support being disposed on at least one of said pins prior to casting.

15. Semiconductor power module according to claim 1, wherein said substrate has a slightly convex curvature, as seen from said lower surface thereof.

16. Semiconductor power module according to claim 2, wherein said substrate has a slightly convex curvature, as seen from said lower surface thereof.

* * * * *